United States Patent
Sun et al.

(10) Patent No.: US 10,247,801 B2
(45) Date of Patent: Apr. 2, 2019

(54) METHOD OF MRI IMAGING USING A SPECTRALLY DESIGNED PULSE

(71) Applicant: The Regents of the University of Michigan, Ann Arbor, MI (US)

(72) Inventors: Hao Sun, Ann Arbor, MI (US); Jon-Fredrik Nielsen, Huntington Woods, MI (US); Douglas C. Noll, Ann Arbor, MI (US); Jeffrey A. Fessler, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 1013 days.

(21) Appl. No.: 14/695,762

(22) Filed: Apr. 24, 2015

(65) Prior Publication Data
US 2015/0309133 A1 Oct. 29, 2015

Related U.S. Application Data

(60) Provisional application No. 61/984,104, filed on Apr. 25, 2014.

(51) Int. Cl.
*G01R 33/30* (2006.01)
*G01R 33/36* (2006.01)
(Continued)

(52) U.S. Cl.
CPC ................ *G01R 33/5614* (2013.01)

(58) Field of Classification Search
CPC .. G01R 33/54; G01R 33/561; G01R 33/5614; G01R 33/565; G01R 33/36; G01R 33/56;
(Continued)

(56) References Cited

U.S. PATENT DOCUMENTS

| 4,480,228 A | 10/1984 | Bottomley |
| 9,791,530 B2 | 10/2017 | Nielsen et al. |

(Continued)

FOREIGN PATENT DOCUMENTS

| WO | 2009053770 A1 | 4/2009 |
| WO | WO2014154461 A1 | 10/2014 |

OTHER PUBLICATIONS

Jakob Assländer et al.; Spin Echo Formation with a Phase Pre-Winding Pulse; Proc. Intl. Soc. Mag. Reson. Med. 21 (2013) p. 4249; Dept. of Radiology—Medical Physics, University Medical Center Freiburg, Freiburg, Germany.

(Continued)

*Primary Examiner* — Son T Le
(74) *Attorney, Agent, or Firm* — Howard & Howard Attorneys PLLC

(57) ABSTRACT

A system and method for acquiring image data from an object that includes a plurality of spins is described. A magnetic field is applied to the object to align the spins along a longitudinal axis. A first pulse is applied to the spins for rotating the spins from the longitudinal axis toward a transverse plane. Image data is acquired from the spins during a free precession interval in which the spins precess in the transverse plane. A second pulse is applied to the spins for rotating the spins from the transverse plane to at least substantially along the longitudinal axis. At least one of the first and second pulses is spectrally or spectrally-spatially designed.

17 Claims, 10 Drawing Sheets

(51) Int. Cl.
*G01R 33/56* (2006.01)
*G01R 33/385* (2006.01)
*G01R 33/561* (2006.01)

(58) Field of Classification Search
CPC .. G01R 33/30; G01R 33/3635; G01R 33/385; G01R 33/307; G01R 33/5608; G01R 33/5607
See application file for complete search history.

(56) References Cited

U.S. PATENT DOCUMENTS

| | | | |
|---|---|---|---|
| 2003/0003053 A1 | 1/2003 | Uetake | |
| 2006/0139027 A1* | 6/2006 | Dreher | G01R 33/485 324/307 |
| 2013/0271134 A1 | 10/2013 | Nielsen et al. | |
| 2015/0253403 A1* | 9/2015 | Grissom | G01R 33/4831 324/309 |
| 2015/0323631 A1* | 11/2015 | Asslaender | G01R 33/4616 324/309 |

OTHER PUBLICATIONS

Oliver Bieri et al.; SSFP Signal With Finite RF Pulses; Magnetic Resonance in Medicine 62, (2009) pp. 1232-1241.
William A. Grissom et al.; Fast Large-Tip-Angle Multidimensional and Parallel RF Pulse Design in MRI. IEEE Transactions on Medical Imaging, vol. 28, No. 10; (2009) pp. 1548-1559.
Shaihan J. Malik et al.; Tailored Excitation in 3D With Spiral Nonselective (SPINS) RF Pulses. Magnetic Resonance in Medicine 67, (2012) pp. 1303-1315.
Jon-Fredrik Nielsen et al.; Small-Tip Fast Recovery Imaging Using Non-Slice-Selective Tailored Tip-Up Pulses and Radiofrequency-Spoiling. Magnetic Resonance in Medicine 69, (2013) pp. 657-666.
John Pauly et al.; Parameter Relations For The Shinnar-Le Roux Selective Excitation Pulse Design Algorithm. IEEE Transactions on Medical Imaging, vol. 10, No. 1; (1991) pp. 53-65.
Greg J. Stanisz et al., $T_1$, $T_2$ Relaxation and Magnetization Transfer In Tissue At 3T. Magnetic Resonance in Medicine 54, (2005) pp. 507-512.
Hao Sun et al.; Strategies for Improved 3D Small-Tip Fast Recovery Imaging; Magnetic Resonance in Medicine; 72; (2014); pp. 389-398.
Hao Sun et al.; Steady-State Functional MRI Using Spoiled Small-Tip Fast Recovery Imaging; Magnetic Resonance in Medicine; 73; (2015) pp. 536-543.
Feng Zhao et al.; Simultaneous Fat Saturation and Magnetization Transfer Preparation With 2D Small-Tip Fast Recovery Imaging; Proc. Intl. Soc. Mag. Reson. Med. 21; (2013) p. 2507.
Jon-Fredrik Nielsen et al.; Small-Tip Fast Recovery Imaging Using Non-Slice-Selective Tailored Tip-Up Pulses and Radiofrequency-Spoiling; Magnetic Resonance in Medicine 2013; pp. 657-666.
Karla L. Miller et al.; Modeling SSFP Functional MRI Contrast in the Brain; Magnetic Resonance in Medicine 60; (2008); pp. 661-673.
Stefan K. Piechnik et al; Modelling vascular reactivity to investigate the basis of the relationship between cerebral blood volume and flow under $CO_2$ manipulation. NeuroImage 39; (2008) pp. 107-118.
E. Mark Haacke et al; In Vivo Measurement of Blood Oxygen Saturation Using Magnetic Resonance Imaging: A Direct Validation of the Blood Oxygen Level-Dependent Concept in Functional Brain Imaging. Human Brain Mapping 5; (1997); pp. 341-346.
O. Bieri et al.; Analysis and Compensation of Eddy Currents in Balanced SSFP. Magnetic Resonance in Medicine 54; (2005); pp. 129-137.
Jon-Fredrik Nielsen et al; Interleaved Balanced SSFP Imaging: Artifact Reduction Using Gradient Waveform Grouping. Journal of Magnetic Resonance Imaging 29; (2009) pp. 745-750.
Chun-Yu Yip et al.; Iterative RF Pulse Design for Multidimensional, Small-Tip-Angle Selective Excitation. Magnetic Resonance in Medicine 54; (2005) pp. 908-917.
Jon-Fredrik Nielsen; Dynamic Perfusion Imaging With Near-Optimal SNR Efficiency Using Arterial Spin Labeling and a Parallel Transmit/Receive Array; NIH Exploratory/Developmental Grant Resubmission (1 R21 EB015091-01); Mar. 16, 2012; pp. 11.

* cited by examiner

FIG. 11A Spectrally Designed Pulse
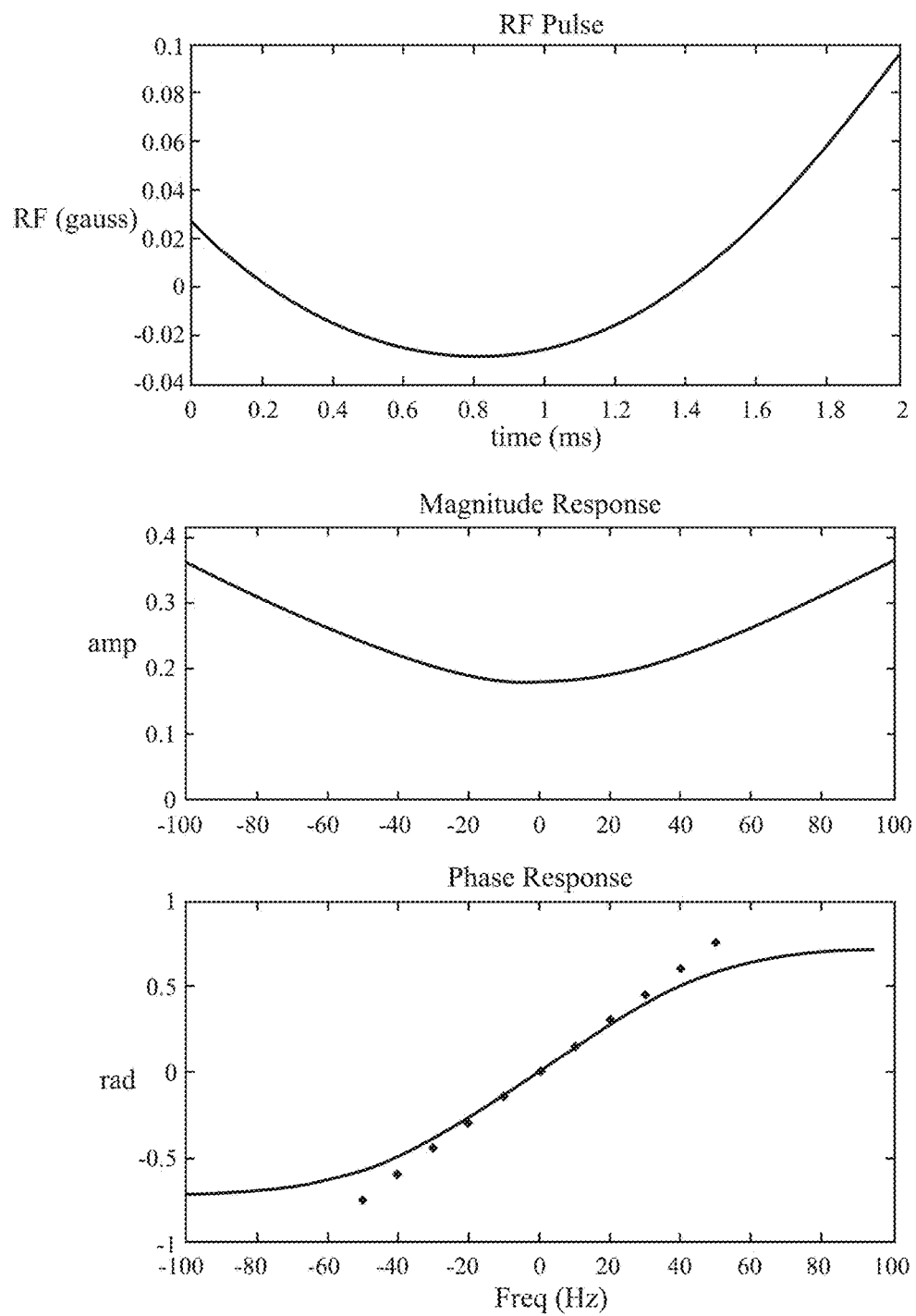

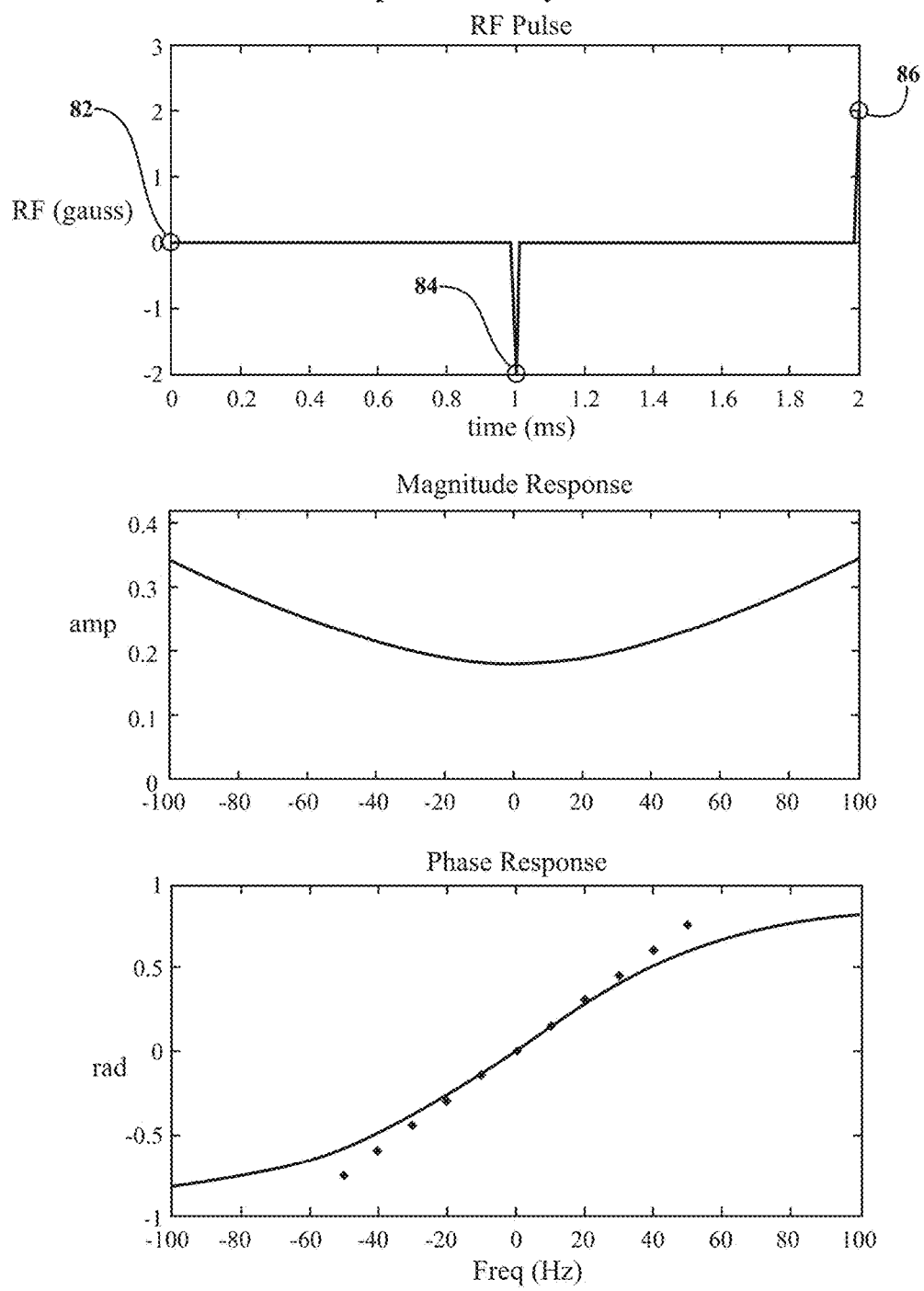
FIG. 11B  Spectrally Designed Pulse Implemented by Sub-Pulses

METHOD OF MRI IMAGING USING A SPECTRALLY DESIGNED PULSE

CROSS-REFERENCE TO RELATED APPLICATION

The present application claims priority from U.S. Provisional Application Ser. No. 61/984,104, filed Apr. 25, 2014, which is herein incorporated by reference.

GOVERNMENT LICENSE RIGHTS

This invention was made with government support under EB012674 and NS058576 awarded by the National Institutes of Health. The government has certain rights in the invention.

BACKGROUND OF THE INVENTION

1. Field of the Invention

The subject invention generally relates to a method of acquiring image data with a magnetic resonance imaging (MRI) system. More particularly, the invention relates to a method of acquiring MRI image data using a sequence of radio frequency (RF) pulses.

2. Description of the Related Art

In magnetic resonance imaging (MRI), a conventional MRI system includes a field magnet that is energized to produce a substantially homogeneous static magnetic (B0) field through a bore in which an object, typically a human body, is placed. The object includes a plurality of atomic nuclei, typically belonging to hydrogen atoms, within organic matter such as tissue, bones, etc. Each of the atomic nuclei exhibits an intrinsic angular momentum and spins about an axis. The magnetic moment of each of the atomic nuclei is known as a spin. The B0 field induces the spins to align with a longitudinal axis defined by the B0 field. The conventional MRI system includes an RF transmitter that temporarily applies an RF pulse to the object to rotate the spins away from the longitudinal axis. Thereafter, the spins precess (rotate) about a plane that is transverse to the longitudinal axis. Gradually, the spins realign to the longitudinal axis as a result of longitudinal relaxation (T1) and transverse relaxation (T2). In so doing, the spins induce a detectable nuclear magnetic resonance (NMR) signal. The conventional MRI system includes gradient coils that generate and temporarily apply magnetic field gradients to the object for determining the spatial location of the spins. The conventional MRI system includes an RF receiver for receiving the NMR signal induced by the spins and a computer for processing the NMR signals to form part of an image corresponding to a scanned region of the object.

The sequence of RF pulses and magnetic field gradients may be repeated every "TR" milliseconds, where TR is an abbreviation for "sequence repetition time." If TR is relatively shorter in duration than the transverse relaxation time T2, the spins will not have sufficient time to realign to the longitudinal axis prior to the application of each RF pulse. As a result, the spins generally approach a dynamic steady-state condition that is a function of tissue relaxation parameters (T1, T2) and imaging sequence parameters, such as flip angle and TR.

One common method of steady-state MRI imaging is balanced steady-state free precession (bSSFP) imaging. Balanced SSFP is also known as balanced fast field echo, FIESTA, and TrueFISP imaging. Balanced SSFP utilizes RF pulses combined with balanced magnetic field gradients, i.e., gradients that act on spins between consecutive RF pulses and preserve the phase of the spins existing before application of the gradient.

Unfortunately, bSSFP imaging suffers from considerable signal loss and off-resonance artifact as a consequence of B0 inhomogeneity. Specifically, a significant loss of SNR and useful image contrast occurs in regions where the B0 frequency offset is an odd integer multiple of one-half of the inverse of TR. Consequently, dark bands may be present in the image, which is undesirable and limits the application of bSSFP imaging. Another limitation of bSSFP imaging is the difficulty of inserting "magnetization preparation" RF pulses that can, for example, suppress fat or alter image contrast in some desirable way.

Accordingly, there remains an opportunity to provide an MRI imaging system and method that overcomes the aforementioned problems.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 11A illustrates charts showing implementations of the spectrally designed pulse according to one embodiment;

FIG. 11B illustrates charts showing implementations of the spectrally designed pulse according to another embodiment.

SUMMARY OF THE INVENTION AND ADVANTAGES

The invention provides a system and method for acquiring image data from an object that includes a plurality of spins. A magnetic field is applied to the object to align the spins along a longitudinal axis. A first pulse is applied to the spins for rotating the spins from the longitudinal axis toward a transverse plane. Image data is acquired from the spins during a free precession interval in which the spins precess in the transverse plane. A second pulse is applied to the spins for rotating the spins from the transverse plane to at least substantially along the longitudinal axis. At least one of the first and second pulses is spectrally or spectrally-spatially designed.

The system and method advantageously interrupt precession of the spins in the transverse plane by applying the second pulse to rotate the spins toward the longitudinal axis. As such, longitudinal magnetization is rapidly and accurately reestablished before reapplication of the method. In turn, the system and method capture a significant amount of the NMR signal induced by the spins.

Additionally, the system and method provide MRI imaging that does not suffer from considerable signal loss and/or reduction in the SNR ratio. Thus, the SNR efficiency and scan quality is improved. As such, the system and method reduce cost by minimizing unnecessary additional scans. The system and method further provide an opportunity to scan in ways that were previously impractical.

The system and method are easier to implement than conventional pulse design methods because at least one of the first and second pulses is spectrally designed. As such, the sequence of pulses can be pre-computed. Furthermore, the system and method are less sensitive to motion than conventional methods.

The system and method further provide MRI images having comparable signal level and similar tissue contrast as images produced by bSSFP, but with reduced off resonance artifact and transient oscillations. Images produced by the system and method have reduced banding artifacts compared to bSSFP. In addition, unlike bSSFP, the techniques employed by the system and method are compatible with magnetization preparation pulses, such as fat saturation (fatsat) pulses and magnetization transfer (MT) pulses. Moreover, the system and method are more robust to the steady-state interruptions caused by such magnetization preparation pulses. The system and method further introduce T2-weighting.

DETAILED DESCRIPTION OF THE INVENTION

Figure 1:
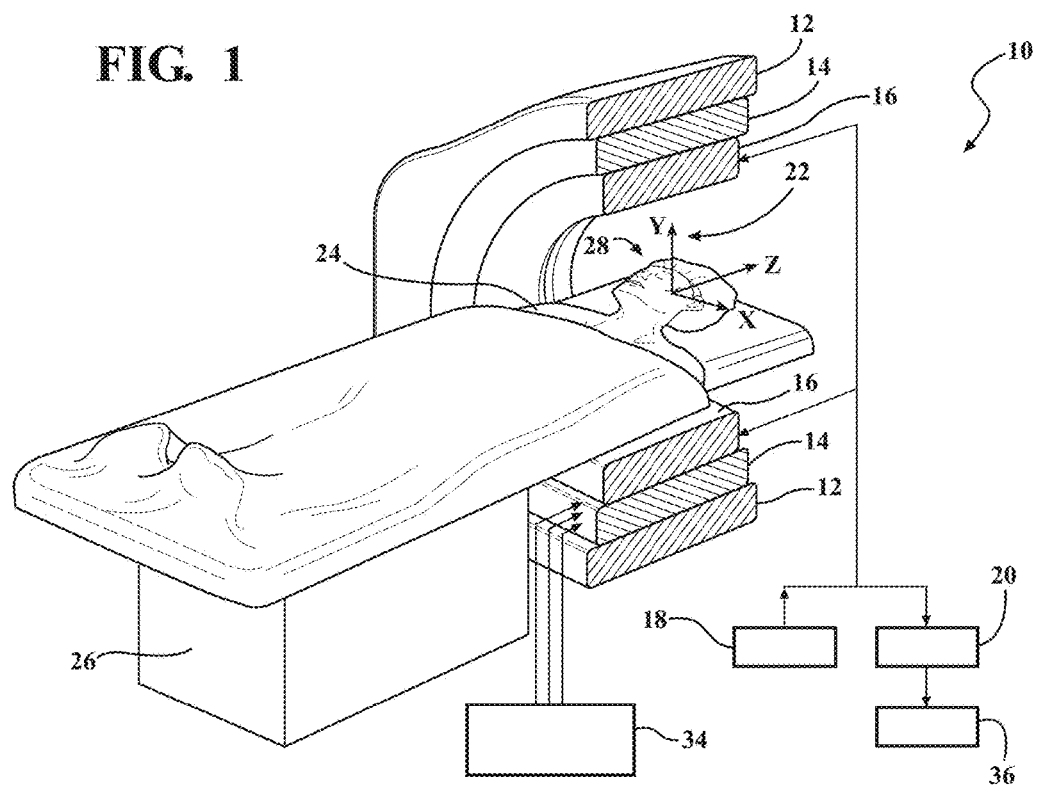
FIG. 1 is a perspective view of an MRI system, partially in cross-section, for implementing a method of acquiring image data from an object, according to one embodiment.

Referring to the Figures, wherein like numerals indicate corresponding parts throughout the several views, an MRI system is generally shown at 10 in FIG. 1. The MRI system 10 generally includes a field magnet 12, a set of gradient coils 14, an RF coil 16, an RF transmitter 18, and an RF receiver 20.

The field magnet 12 has a coaxial cylindrical configuration and defines a bore 22 therein. An object 24, typically a human body, is disposed on a support 26 that is moveable within the bore 22. The gradient coils 14 and the RF coil 16 are disposed within the bore 22 of the field magnet 12.

The MRI system 10 conventionally images a region of interest (ROI) 28 of the object 24. For simplicity, the ROI 28 is shown as a human head in FIG. 1. In one embodiment, the ROI 28 is imaged according to a plurality of slabs or slices. Each slice is generally a planar region having any suitable thickness, such as 10 mm. The MRI system 10 combines the slices to construct an image of the ROI 28. The MRI system 10 may combine the slices to construct a 2D image or a 3D image of the ROI 28 without departing from the scope of the present invention. The slices may be of arbitrary orientation, such as sagittal, coronal, or oblique orientation.

Figure 2:
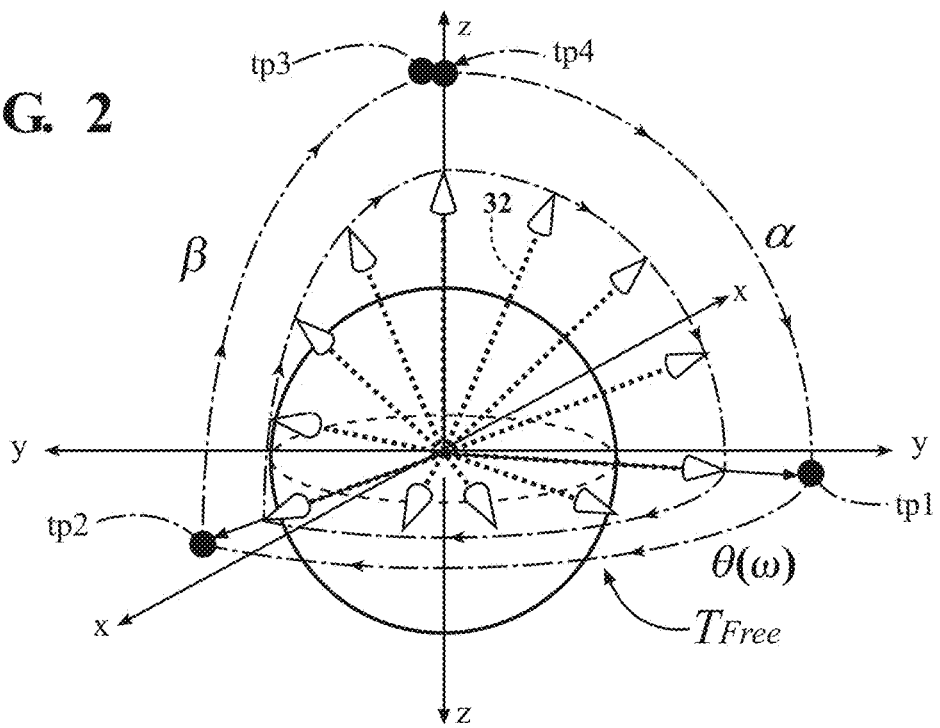
FIG. 2 is an illustration of a steady-state spin path for a single spin shown along a longitudinal axis (z) and a transverse plane (x, y), according to one embodiment.

The object 24 imaged by the MRI system 10 includes a plurality of atomic nuclei, typically within organic matter such as tissue, bones, etc. However, the atomic nuclei may be in other matter besides organic matter. In FIG. 2, one atomic nucleus is shown as a sphere for exemplary purposes. Each of the atomic nuclei exhibits an intrinsic angular momentum such that each of the atomic nuclei spins about an axis. The axis represents a magnetic moment of the atomic nucleus. The magnetic moment of each of the atomic nuclei is hereinafter referred to as a spin. The spins are capable of moving within a frame of reference defined generally by the sphere and its interior.

The ROI 28 includes a plurality of spins 32 within each respective slice being imaged. The spins 32 induce a nuclear magnetic resonance (NMR) signal for enabling acquisition of image data, as will be described below. For simplicity, a single spin 32 is shown in FIG. 2. Each spin 32 can, at any given moment, rotate about a single axis of rotation. As will be described below, the various components of the MRI system 10 manipulate the spins 32 to generate the image. The axis of rotation can vary as the spin 32 is manipulated during imaging. FIG. 2 illustrates a path of movement of one spin 32, according to one embodiment. In FIG. 2, one spin 32 is illustrated repeatedly to illustrate how the spin 32 rotates as the spin 32 is manipulated during imaging.

The field magnet 12 produces a substantially homogeneous magnetic field through the bore 22 in which the object 24 is placed. The homogeneous magnetic field is hereinafter referred to as a B0 field. In practice, the B0 field may not be perfectly homogenous and may vary in homogeneity along the object 24.

As shown in FIGS. 1 and 2, the B0 field defines a longitudinal axis (z). In FIG. 1, the longitudinal axis (z) corresponds to an axis of the bore 22 and passes between the head of the object 24 and the feet of the object 24.

As shown in FIGS. 1 and 2, the B0 field further defines a plane (x, y) that is perpendicular and transverse to the longitudinal axis (z) (hereinafter referred to as the "transverse plane"). The transverse plane (x, y) is defined by a first transverse axis (x) and a second transverse axis (y). In FIG. 1, the first transverse axis (x) passes horizontally through the object 24 and the second transverse axis (y) passes vertically through the object 24.

The gradient coils 14 are typically driven by a gradient controller 34. As the gradient coils 14 are driven, the gradient coils 14 produce respective magnetic field gradients Gx, Gy, Gz for spatially encoding positions of the spins 32. Magnetic field gradients Gx, Gy, Gz are generated along the first transverse axis (x), the second transverse axis (y), and the longitudinal axis (z), respectively. The gradient coils 14 apply the magnetic field gradients Gx, Gy, Gz to vary the B0 field linearly across the ROI 28 under imaging. The gradient coils 14 are configured to selectively superimpose the magnetic field gradients Gx, Gy, Gz on the B0 field. In some instances, the gradients Gx, Gy, Gz may be applied to enable selective spatial excitation of the ROI 28. In other instances, as described below, the gradients Gx, Gy, Gz may be set to zero during imaging such that spatially selective excitation of the ROI 28 does not occur.

The MRI system 10 employs the RF coil 16 and the RF transmitter 18 to apply a sequence of RF pulses to the ROI 28. The sequence of RF pulses is applied to the spins 32 to excite and temporarily manipulate the spins 32. The MRI system 10 may employ any suitable method for applying the sequence of RF pulses, including but not limited to, methods employing a single channel or multi-channel transmission array.

The RF receiver 20 is configured to receive the NMR signal induced by the spins 32. The MRI system 10 includes a processor 36 to process the NMR signals to form part of the image corresponding to the ROI 28 of the object 24. The MRI system 10 repeatedly applies the sequence of RF pulses along several slices of the ROI 28 to construct the entire image of the ROI 28. The processor 36 is connected to a display to provide the image of the ROI 28 on the display.

The MRI system 10 in FIG. 1 is intended to be a simplified and exemplary illustration. As such, the MRI system 10 may have various other configurations other than the configuration shown in FIG. 1. The MRI system 10 may include other components not specifically shown in FIG. 1. Furthermore, it is to be appreciated that other MRI systems 10 may be capable of implementing the present invention.

Figure 3:
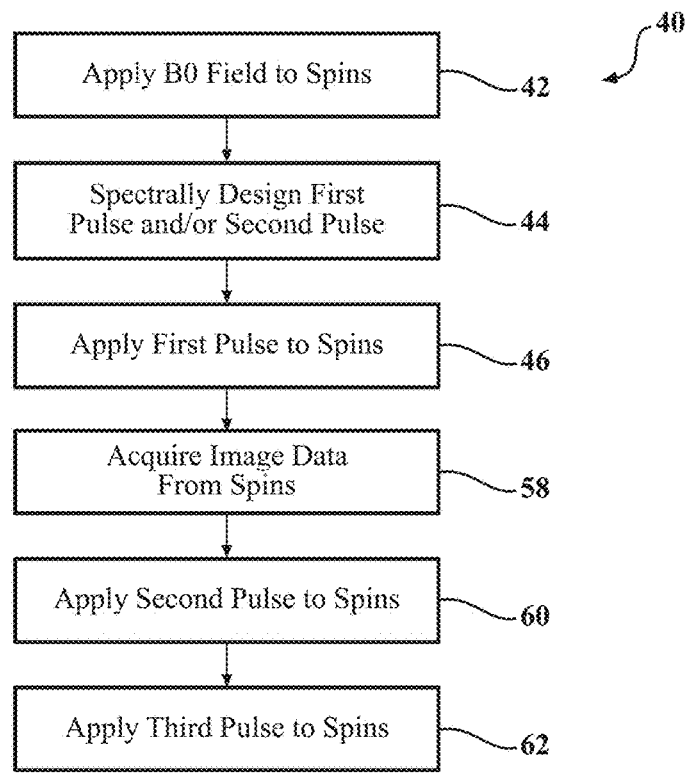
FIG. 3 is a flowchart illustrating steps of the method of acquiring image data from the object with the MRI system, according to one embodiment.
Figure 4:
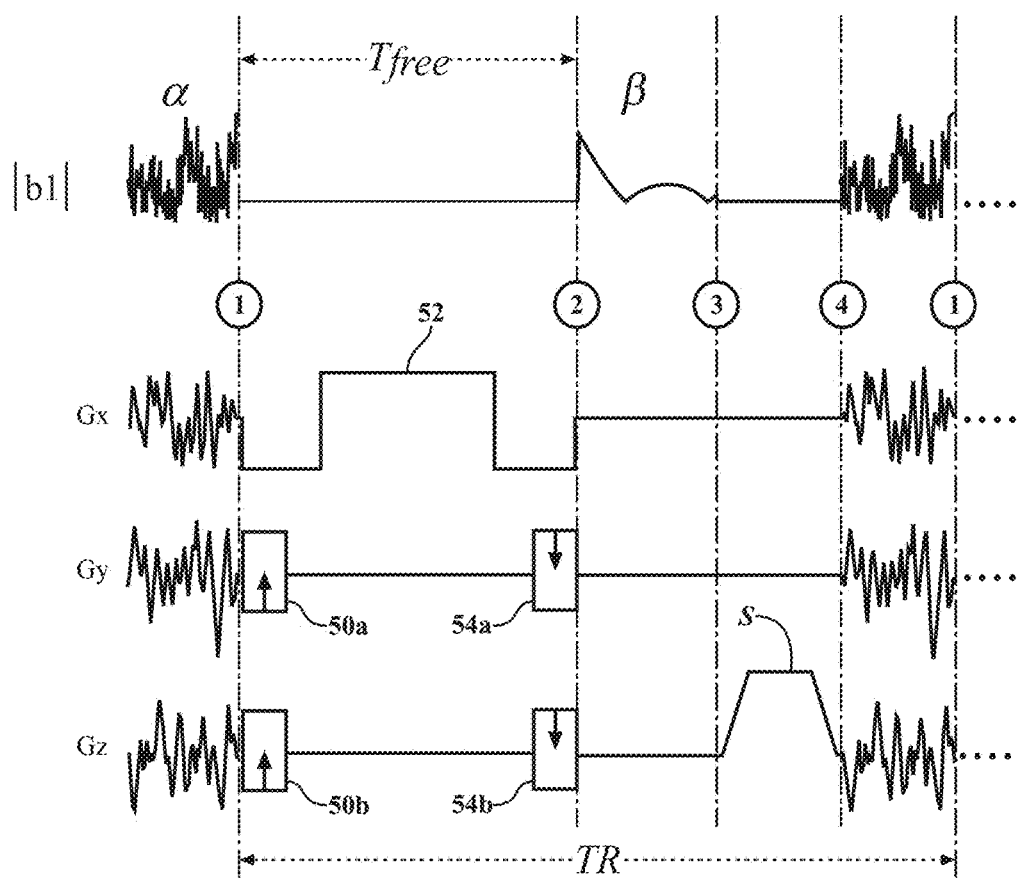
FIG. 4 is a pulse sequence diagram depicting an implementation of a sequence of RF pulses, according to one embodiment.

As illustrated in FIG. 3, the MRI system 10 implements a method 40 of acquiring image data from the object 24. The method 40 implements the sequence of RF pulses during the TR. The sequence of RF pulses applied during TR includes a first pulse α and a second pulse β. FIG. 4 illustrates an exemplary pulse sequence diagram depicting an implementation of the sequence of RF pulses in accordance with the method 40.

At step 42, the B0 field is applied to the object 24 to align the spins 32 along the longitudinal axis (z). By doing so, the spins 32 become oriented parallel to the longitudinal axis (z). Generally, the B0 field is continuously applied to the object 24 throughout the method 40 of acquiring image data.

The first pulse α is designed to excite the desired imaging region. As shown in FIG. 2, the first pulse α is configured to tip the spins 32 toward the transverse plane (x, y) according to a predetermined angle. When viewed according to the spatial orientation of the transverse plane (x, y) in FIG. 2, the first pulse α tips the spins 32 down from the longitudinal axis (z) toward the transverse plane. In some instances, the first pulse α may have any arbitrary phase (direction) and such that the spins 32 need not be aligned precisely with the first transverse axis (x) or the second transverse axis (y) of the transverse plane (x, y), as shown in FIG. 2.

For simplicity, the first pulse α may be considered a "tip-down" pulse that tips the spins 32 down according to a predetermined "tip-down" angle. The phrase "tip-down" is used to illustrate the motion and orientation of the spins 32 according to the spatial orientation shown in FIG. 2. Therefore, the phrase "tip-down" is not intended to limit the characteristics of the first pulse α. The tip-down angle is typically defined between 0 and 90 degrees. The preferred tip-down angle may be different for various types of organic matter being imaged. In one example, the tip-down angle is small, i.e., less than 10 degrees. By selecting small tip-angles, longitudinal magnetization is preserved allowing for T2 weighting with short TR.

At step 44, the method may include the step of spectrally designing the first pulse α. By being spectrally designed, the first pulse α is designed with specific spectral properties. By being spectrally designed, the first pulse α does not excite a spatial region of a particular shape, e.g., slice/slab, but rather excites all spins 32 within a particular target frequency range, regardless of spatial position. In one embodiment, the spectrally designing the first pulse α includes pre-winding a phase of the spins 32 based on frequency. As such, the spectrally designed first pulse α may be defined as a spectral pre-winding pulse. The phase of the spins is matched to a function of the off-resonance frequency of the spins. For example, spectrally designing the first pulse α may include matching the phase of the spins 32 to the product of the off-resonance frequency ω of the spins 32 and the free precession time. The first pulse α takes a particular frequency dependent phase distribution and tips the phase distribution down. As such, the pre-winding of the phase of the spins 32 is frequency dependent. In such instances, the first pulse α is generally not spatially tailored. In other words, the pre-winding of the phase of the spins 32 is not spatially dependent on the accumulated phase calculated from the B0 map. In other words, there may be no need to calculate the B0 map for the spectrally designed first pulse α. In instances where the first pulse α is spectrally designed and not spatially dependent, the entire ROI 28 to which the RF coil 16 is sensitive, is generally excited after applying the first pulse α such that the entire ROI 28 is imaged. The first pulse α may be spectrally designed by any suitable component of the MRI system 10, including, but not limited to the processor 36.

The first pulse α may be spectrally designed according to various methods. In one example, spectrally designing the first pulse α includes computing a frequency spectrum defined by the following equation:

$$d(\omega) = \sin \alpha \, \exp^{(i\omega T_{free}/2)} \qquad [1]$$

In equation [1], α is a flip, or tip-down, angle of the spins, ω is an off-resonance frequency of the spins, and $T_{free}$ is the free precession interval. The flip angle α is uniform for all spins 32. Equation [1] is a function of the off-resonance frequency ω of the spins 32, rather than a spatial position of the spins 32.

The first pulse α may be spectrally designed according to various frequency spectra. The frequency spectrum may be pre-computed and is typically finite. The frequency spectrum has a spectral bandwidth. In one embodiment, the spectral bandwidth is 300 Hz. In another embodiment, the spectral bandwidth is 150 Hz, such as the bandwidth defined by −75 to 75 Hz.

In another embodiment, the first pulse α may not be spectrally designed. For instance, the first pulse α may be spatially designed and slice-selective. To implement the first pulse α as spatially designed, the B0 map may be acquired from the object 28 for determining magnetization characteristics of the spins 32. The first pulse α may be spatially selective in one, two or three dimensions to limit the volume to be imaged. Thereafter, the phase of the spins 32 may be pre-wound dependent on the accumulated phase calculated from the B0 map. In such embodiments, the first pulse α may be implemented according to various designs and methods, including but not limited to a sinc function, a Shinnar-Le Roux algorithm, and the like. As will be described below, the first pulse α may be spatially (non-spectrally) designed in instances where the second pulse β is spectrally designed, and vice-versa.

At step 46, and as shown in FIGS. 2 and 4, the first pulse α is applied to the spins 32 for rotating the spins 32 from the longitudinal axis (z) toward the transverse plane (x, y). The spins 32 may rotate away from the longitudinal axis (z) according to various degrees and need not rotate 90 degrees directly to the transverse plane (x, y). As shown in FIGS. 2 and 4, the moment directly after application of the first pulse α is identified according to time-point one (tp1).

The first pulse α is generally applied to the spins 32 by the implementation of an RF waveform. In instances where the first pulse α is spectrally designed, the first pulse α may be implemented by the RF waveform computed by solving for b in the following equation:

$$b = \mathrm{argmin}_b \left\{ \frac{1}{2} \|d(\omega) - Ab\|_2^2 + \lambda \|b\|_2^2 \right\}, \quad [2]$$

In equation [2], d(ω) corresponds to equation [1], λ is a Regularization parameter, such as a Tikhonov Regularization parameter, and A is a small tip angle approximation matrix with $a_{ij} = i\gamma M_0 e^{i\Delta\omega_i(t_j - T)}$. In some instances, there may be no phase encoding term $(ik(t_j)r_i)$ in A if all gradients are set to zero for spectral selectivity. When spatially designed, the first pulse α may be implemented by various other RF waveforms without departing from the scope of the invention.

Figure 5A:
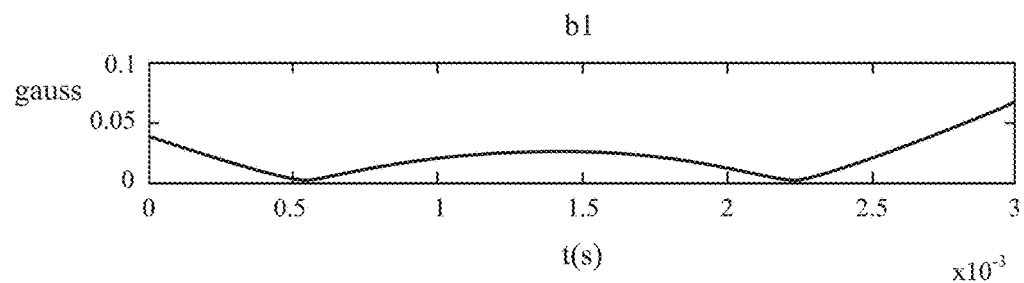
FIG. 5A is a chart illustrating a magnitude of a spectrally designed pulse wherein $T_{free}$ is 4.9 ms, according to one embodiment.
Figure 5B:
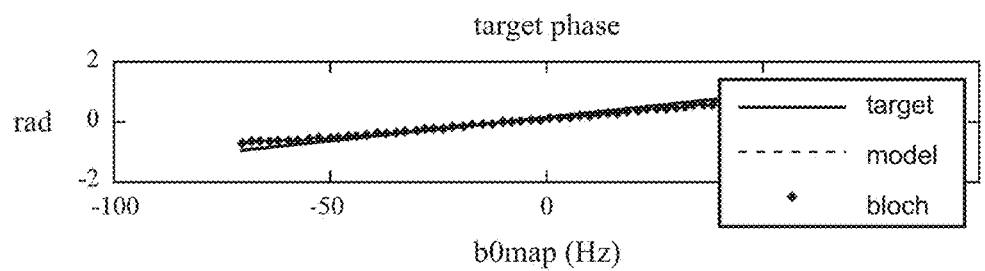
FIG. 5B is a chart illustrating a phase of the spectrally designed pulse in FIG. 5A.
Figure 5C:
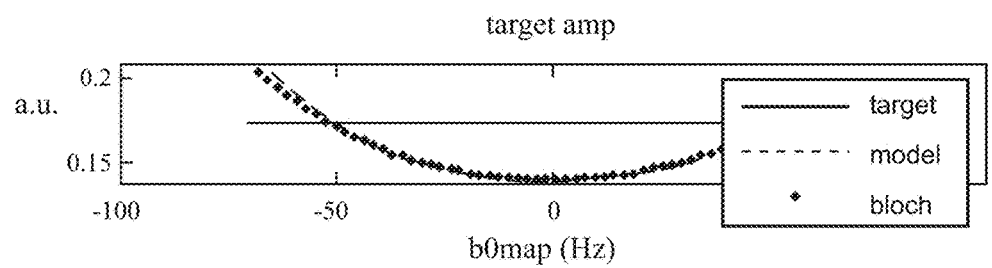
FIG. 5C is a chart illustrating an amplitude of the magnetization produced by the spectrally designed pulse in FIG. 5A.

The Regularization parameter λ controls tradeoff between RF power and excitation accuracy. The Regularization parameter λ may vary depending upon the desired relationship between RF power and excitation accuracy. FIGS. 5A-5C illustrate a simulation of the effect of regularization parameter λ on the spectrally designed first pulse α. In FIGS. 5A-5C the Regularization parameter λ is selected to be relatively large and an excitation flip angle of 10 degrees is utilized in the simulation. In each of FIGS. 5A-5C, $T_{free}$ is 4.9 ms. In FIG. 5A, the Regularization parameter λ allows for regularization and suppression of the b1 magnitude during excitation. FIGS. 5B and 5C illustrate how the Regularization parameter λ maintains accuracy of the small tip angle approximation A such that the difference between the small tip angle approximation (model) and the Bloch simulation (Bloch) is minimized. Mainly, the line identified by "target" substantially aligns with the line identified by "Bloch" for the target phase illustrated in FIG. 5B and the target amplitude illustrated in FIG. 5C. An alternative embodiment to equation [2] is to minimize the first term ∥d(ω)−Ab∥ subject to a power constraint on the RF waveform b. Other related embodiments trade-off excitation accuracy and pulse duration and pulse power by suitable optimization methods.

Figure 6:
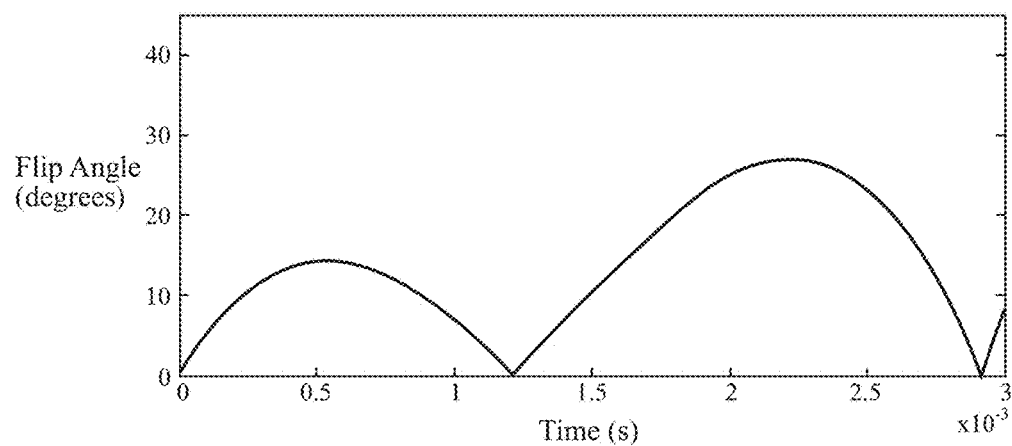
FIG. 6 is a chart illustrating flip angle characteristics exhibited during application of the spectrally designed pulse, according to one embodiment.

FIG. 6 illustrates a simulation of the tip angle of the spins 32 during application of the spectrally designed first pulse α. In FIG. 6, the first pulse α is applied for the duration of about 3 ms and $T_{free}$ is 4.9 ms. However, the first pulse α may be applied for any suitable duration. As shown in FIG. 6, the flip angle may be kept relatively small, i.e., under 30 degrees, during application of the spectrally designed first pulse α. The flip angle is largest approximately near 2.2 ms. The simulation of the tip-down angle as shown in FIG. 6 is not intended to limit the scope of the spectrally designed first pulse α. Mainly, the simulation may be manipulated by modifying the Regularization parameter λ such that the flip angle exhibits different properties.

The magnetic field gradients Gx, Gy, Gz may be set to zero during application the first pulse α. Setting the magnetic field gradients Gx, Gy, Gz to zero enables tip-down excitation by the first pulse α to be spectrally selective yet non-slice-selective. By having the first pulse α be spectrally selective, complexity of the first pulse α is reduced and the first pulse α may be implemented over a shorter duration than a slice-selective pulse.

By being spectrally designed, the first pulse α is configured to form a spin echo after its application to the spins 32. The spin echo creates an NMR signal. The spins 32 dephase over the spectral band after application of the first pulse α. The spins 32 realign and/or rephase during an echo time (TE), which represents a duration between the application of the first pulse α and a peak of the spin echo signal. The small-tip angle of the first pulse α allows for effective rephasing of the spins 32 over the spectral band. The first pulse α realigns the spins 32 from the spectral band to form the spin echo. The spins 32 may exhibit any suitable echo time after application of the first pulse α.

As mentioned above, the TR is repeated during imaging. In one embodiment, the TR defines a duration between successive sequences applied to the same slice. For example, in FIG. 3, TR is defined between application of the first pulse α and the application of a subsequent first pulse α.

At step 58, image data is acquired from the spins 32 during a free precession interval ($T_{free}$) in which the spins 32 precess in the transverse plane (x, y). Theoretically, it may be understood that the spins 32 include a transverse component that precesses in the transverse plane (x, y). The image data acquired corresponds to the NMR signals exhibited by transverse component of the spins 32. This image data is utilized to construct the respective slice of the ROI 28 being imaged. Accordingly, image data for the slice is processed by the MRI system 10 and the slice is ultimately displayed.

The step 58 of acquiring image data from the spins 32 during $T_{free}$ occurs typically after the step 46 of applying the first pulse α. Said differently, the first pulse α rotates the spins 32 from the longitudinal axis (z) toward the transverse plane (x, y) and then image data is acquired as the spins 32 precess in the transverse plane (x, y).

As shown in FIGS. 2 and 4, the period during which image data is acquired during $T_{free}$ is defined between time-point one (tp1) and time-point two (tp2). Image data may be acquired at any moment during $T_{free}$. The duration of $T_{free}$ may be any suitable duration for any given ROI 28. In one embodiment, $T_{free}$ is approximately 10 ms.

When the first pulse α is spectrally designed, the phase of the spins 32 at the beginning of the free precession interval may be defined by the following expression:

$$\omega T_{free}/2 \quad [3]$$

In expression [3], ω is an off-resonance frequency of the spins, and $T_{free}$ is the free precession interval. In one embodiment, the first pulse α pre-phases the spins 32 according to expression [3]. Again, because the first pulse α is spectrally designed, the phase of the spins 32 is frequency dependent, rather than spatially dependent.

During $T_{free}$, magnetic field gradients Gx, Gy, Gz may be applied according to various methods and configurations in order to capture the image data. In one example, as shown in FIG. 4, magnetic field gradient Gy and Gz provide encoding gradients 50a, 50b during $T_{free}$ for locating the NMR signals. The encoding gradients 50a, 50b alter the phase spins 32 by phase encoding. Thereafter, magnetic field gradient Gx provides a readout gradient 52 for frequency encoding and collecting data of the object 24 being imaged. After the readout gradient 52, magnetic field gradients Gy and Gz each further provide a rewinder gradient 54a, 54b that has equal amplitude but opposite polarity as the respective encoding gradients 50a, 50b. The rewinder gradients 54a, 54b are applied after data collection for cancelling phase encoding by the encoding gradient 50. By doing so, the rewinder gradients 54a, 54b ensure that a similar net phase is provided during data readout for a subsequent TR.

The magnetic field gradients Gx, Gy, Gz may be implemented to acquire image data according to various other methods without departing from the scope of the invention. Moreover, acquiring image data may be implemented by any suitable readout technique, such as spiral, radial, or echo-planar readout techniques. In such instances, the imaging gradients 50, 52, 54 in FIG. 4 could be replaced with spiral, radial, or echo-planar imaging gradients without departing from the scope of the invention.

At step 60, a second pulse β is applied to the spins 32 for rotating the spins 32 from the transverse plane (x, y) to at least substantially along the longitudinal axis (z). As shown throughout the Figures, the moment immediately after the second pulse β is applied is identified according to timepoint three (tp3). As shown in FIG. 2, the second pulse β interrupts precession of the spins 32 in the transverse plane (x, y) by rotating the spins 32 toward the longitudinal axis (z). In so doing, the second pulse β substantially eliminates transverse magnetization exhibited by the spins 32. As such, the NMR signal is substantially suppressed for the frequency bandwidth being imaged. By interrupting precession of the spins 32, the second pulse β substantially reduces the duration of the TR required to achieve a given longitudinal magnetization prior to application of the first pulse α. In turn, the MRI system 10 is capable of providing reduced scan-time. In some embodiments, the second pulse β may be defined as a "fast recovery" pulse.

As is described in detail below, in some instances, the spins 32 rotate from the transverse plane (x, y) perfectly to the longitudinal axis (z). However, in practice, some spins 32 may not perfectly align with the longitudinal axis (z). For example, all the spins 32 may be misaligned with the longitudinal axis (z) by a few degrees. Alternatively, the vast majority of spins 32 may be perfectly aligned with the longitudinal axis (z), while a few spins 32 are misaligned. Therefore, it is sufficient that the spins 32 be significantly aligned with the longitudinal axis (z), rather than perfectly aligned with the longitudinal axis (z).

As shown in FIG. 4, the second pulse β is an RF pulse that is applied during the TR of the sequence. For any given TR, application of the second pulse β generally occurs after the acquisition of image data from the spins 32 during $T_{free}$. In FIG. 4, $T_{free}$ begins after application of the first pulse α and ends at the start of the second pulse β. The second pulse β may be applied for any suitable duration. In one example, the second pulse β is applied for less than 2 ms.

The second pulse β acts as a "tip-up" pulse for tipping the spins 32 toward the longitudinal axis (z). The term "tip-up," as used herein with respect to the second pulse β refers to the tip direction of the spins 32 relative to the spatial orientation of the longitudinal axis (z) and the transverse plane (x, y) as depicted in FIG. 2. Therefore, the phrase "tip-up" is not intended to limit the characteristics of the second pulse β. The tip-up angle may be designed such that each of the spins 32 aligns substantially parallel with the longitudinal axis (z). The tip-up angle is preferably defined between 0 and 90 degrees. However, the tip-up phase may be different for each one of the respective spins 32. In one example, the tip-up angle of the second pulse β corresponds to the tip-down angle of the first pulse β. In one embodiment, the second pulse β tips-up all the spins 32 that were originally tipped-down by the first pulse α in the sequence.

Similar to the first pulse α, the second pulse β may be spectrally designed. As such, the description above relating to the characteristics of the spectrally designed first pulse α is applicable to the spectrally designed second pulse β. In one embodiment, the second pulse β may be considered a "post-winding" pulse configured to take a particular frequency dependent phase distribution and tip the phase distribution up.

The second pulse β may be spectrally designed according to various methods. In instances where the first pulse α and the second pulse β are both spectrally designed, the first pulse α may pre-phase the spins 32 by $+\omega T_{free}/2$ such that phase of the spins 32 is $-\omega T_{free}/2$ after the free precession interval. Mainly, the accumulated phase during the free precession interval is $-\omega T_{free}$. At the time of the second pulse β, the phase of the spins is $-\omega T_{free}/2$, which is the sum of $+\omega T_{free}/2$ and $-\omega T_{free}$. If the first pulse α is not spectrally designed and the second pulse β is spectrally designed, the second pulse β may have a target phase of $<\omega T_{free}$, which is the phase of the spins 32 before the second pulse β.

In another example, spectrally designing the second pulse β includes computing a frequency spectrum defined by the following equation:

$$d(\omega) = \sin\beta\ \exp^{(-\omega T_{free}/2)} \quad [4]$$

In equation [4], β is a flip, or tip-up, angle of the spins, ω is an off-resonance frequency of the spins, and $T_{free}$ is the free precession interval. The flip angle β is uniform for all spins 32. Similar to equation [1], equation [4] is a function of the off-resonance frequency ω of the spins 32, rather than the spatial position of the spins 32. Unlike equation [1], the phase component $i\omega T_{free}/2$ in equation [4] is inverted. However, the phase component need not be inverted depending upon the convention used. For example, if the B0 field is in the positive z-direction, the rotating frequency ω is positive. Moreover, if the spins 32 rotate clockwise, the accumulated phase during the free-precession interval is a generally negative.

In instances where the first pulse α and the second pulse β are spectrally designed, the second pulse β may be designed by first designing an intermediate tip-down pulse with a negated B0 map and excitation pattern of equation [4]. In such instances, a final second pulse β is designed by negating and time-reversing the intermediate tip-down pulse.

In some instances, the second pulse β may not be spectrally designed. For instance, the second pulse β may be spatially designed according to similar methods described above for the non-spectrally designed first pulse α. However, at least one of the first pulse α or second pulse β is spectrally designed. In one embodiment, only the first pulse α is spectrally designed. In such instances, spectral designing is utilized only for excitation (tip-down) of the spins 32. In another embodiment, only the second pulse β is spectrally designed. In such instances, spectral designing is utilized only for recovery (tip-up) of the spins 32. In yet another embodiment, both the first pulse α and the second pulse β are spectrally designed such that spectral designing is utilized for both excitation and recovery of the spins 32.

The second pulse β is generally applied to the spins 32 by the implementation of an RF waveform and accompanying gradients. In instances where the second pulse β is spectrally designed, the second pulse β may be implemented by the RF waveform computed by solving for b in equation [2]

wherein d (ω) corresponds to equation [4]. In calculating the RF waveform for implementing the second pulse β, b is time-reversed and negated.

As shown in FIG. 4, the magnetic field gradients Gx, Gy, Gz may be set to zero during application the second pulse β. Additionally, the B0 map may be negated during design of the second pulse β.

Ideally, the second pulse β perfectly aligns the spins 32 with the longitudinal axis (z). The phase of each spin 32 matches the respective off-resonance frequency, regardless of spatial position. In such instances, there is no phase mismatch Δθ between the phase of the second pulse β and a phase θ of the local spins 32. In other words, the phase mismatch Δθ is zero. Matching the phase of each spin 32 to the respective off-resonance frequency leads to pure T2 (in addition to T1) contrast.

In practice, however, the second pulse β may not rotate each spin 32 directly to the longitudinal axis (z). In other words, although the second pulse β may substantially align the spins 32 with the longitudinal axis (z), some spins 32 may not be aligned perfectly along the longitudinal axis (z), thereby leaving some residual transverse magnetization. For example, this may occur if the phase mismatch Δθ is non-zero. For specific applications, the phase mismatch Δθ may be intentionally designed to be non-zero. In such instances, the phase of the second pulse β may be intentionally mismatched to correspond with the non-zero phase mismatch Δθ. For instance, such an application may be utilized to partially suppress signal from certain parts of the image, or from certain tissue types, e.g., fat tissue, based on the off-resonance (B0) frequency of the specific tissue type.

In one embodiment, the repeated process of applying the first pulse α, acquiring imaging data during $T_{free}$, and interrupting precession with the second pulse β, may be referred to as a spectral small-tip fast recovery (STFR) process. When used in combination with at least one spectrally designed pulse, the path of the spins 32 in such an STFR process leads to production of a unique steady-state signal level.

At step 62 in FIG. 3, a third pulse S may be applied to the spins 32 after the signal recovery pulse to mitigate off-resonance artifacts. In one embodiment, the third pulse S may be applied to eliminate residual transverse magnetization occurring from the spins 32 not being aligned along the longitudinal axis (z) after application of the second pulse β. In such instances, the third pulse S is configured to align the spins 32 to the longitudinal axis (z). Application of the third pulse S ensures that the spins 32 are oriented parallel to the longitudinal axis (z). Alternatively, residual transverse magnetization may exist irrespective of misalignment of the spins 32 to the longitudinal axis (z). For instance, residual transverse magnetization may exist because of T1 and T2 relaxation.

The phrase "pulse S" is used herein in a general sense and may be construed to include a physical gradient pulse αs shown in FIG. 4, and the application of quadratic RF phase-cycling (linear phase increment from TR-to-TR, as will be described below). The third pulse S is typically applied before completion of the TR. More specifically, the third pulse S is applied after application of the second pulse β and before application of a subsequent first pulse α. As shown in FIGS. 2 and 4, the third pulse S is applied between tp3 and tp4.

In one embodiment, the third pulse S may be an unbalanced gradient. In such instances, the third pulse S is implemented as a through-plane magnetic field gradient. For example, as shown in FIG. 4, the through-plane magnetic field gradient is magnetic field gradient Gz for an axial slice. The magnetic field gradient Gz is unbalanced such that the phase of the spins 32 existing before application of the magnetic field gradient Gz is generally not preserved after application of the magnetic field gradient Gz. The unbalanced gradient may alternatively be defined as a gradient crusher. The third pulse S may implement the magnetic field gradient Gz pursuant to a predetermined waveform configured to de-phase the spins 32 such that the spins 32 are incoherently orientated before the end of the TR. As such, the method 40 may employ incoherent imaging. That is, spins 32 imaged within a slice undergo motion according to phases, velocities, and directions different than other spins 32 within the same slice. It is to be understood that the unbalanced gradient may be applied along any spatial direction. For instance, the unbalanced gradient may be applied along the largest voxel dimension (typically through-slice).

In other embodiments, the third pulse S may be replaced by RF-spoiling. In RF-spoiling, pulses α and β are applied according to different phases to excite the spins 32 for successive RF transmissions. Specifically, the RF phase may be incremented by any suitable phase increment. In some cases, the third pulse S may include a combination of an unbalanced gradient and an RF-spoiling to eliminate residual transverse magnetization.

It is to be appreciated that the principles described herein may be utilized to perform transient, non-steady-state imaging. Specifically, non-steady-state imaging may be achieved by applying the same sequence of the first pulse α, the second pulse β, and the third pulse S in rapid succession with a suitable RF phase cycling scheme.

In another embodiment, the third pulse S may also include additional RF and gradient pulses to provide additional contrast via magnetization preparation, such as fat saturation (fatsat) pulses and magnetization transfer (MT) pulses.

Figure 7:
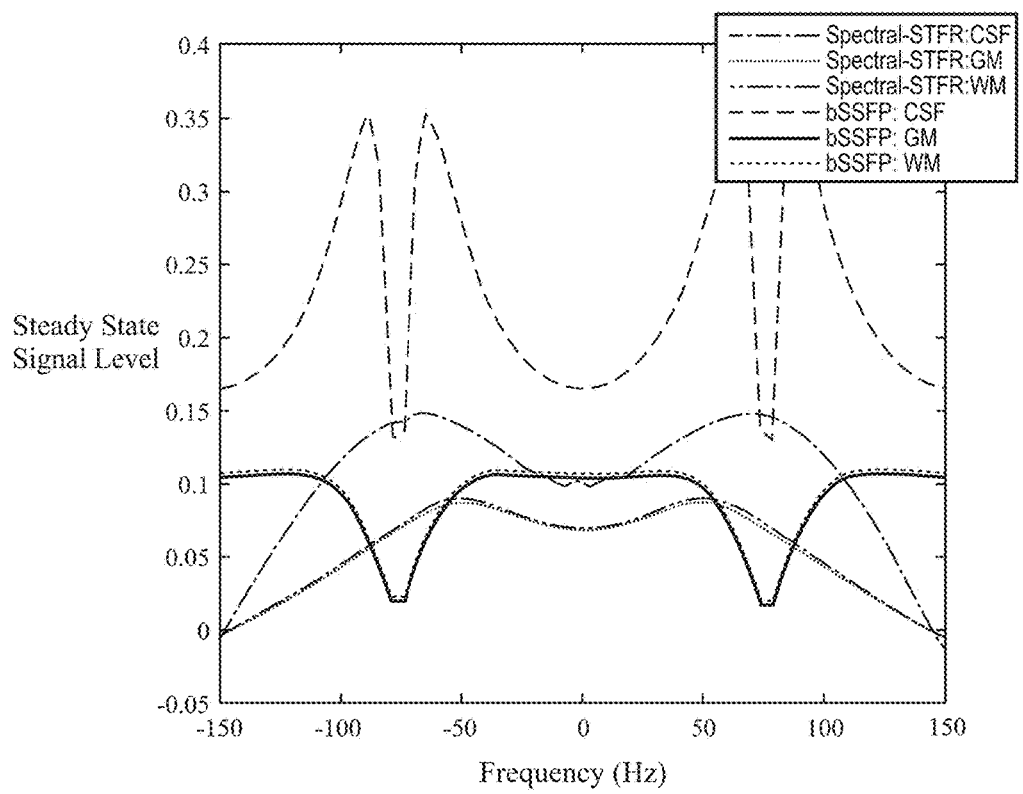
FIG. 7 is a chart comparing a simulated banding profile exhibited by bSSFP with a banding profile exhibited by the method of the subject invention, according to one embodiment.

FIG. 7 shows a simulated steady-state signal banding profile for bSSFP as compared with the spectral-STFR method of the present invention. The comparison shows the steady-state signals for gray matter (GM), white matter (WM), and Cerebrospinal fluid (CSF). The simulation is conducted over a 300 Hz (−150 to +150 Hz) bandwidth with 4.9 ms readout time. The flip angle is 10° for spectral-STFR and 20° for bSSFP. The regularization parameter is set to 0.6. As illustrated, spectral-STFR exhibits a wider passband than bSSFP. The banding shape of CSF and GM/WM are more similar for spectral-STFR as compared with bSSFP, indicating a consistent tissue contrast across the frequency band. The banding profile for spectral-STFR is also symmetrical.

Figure 8:
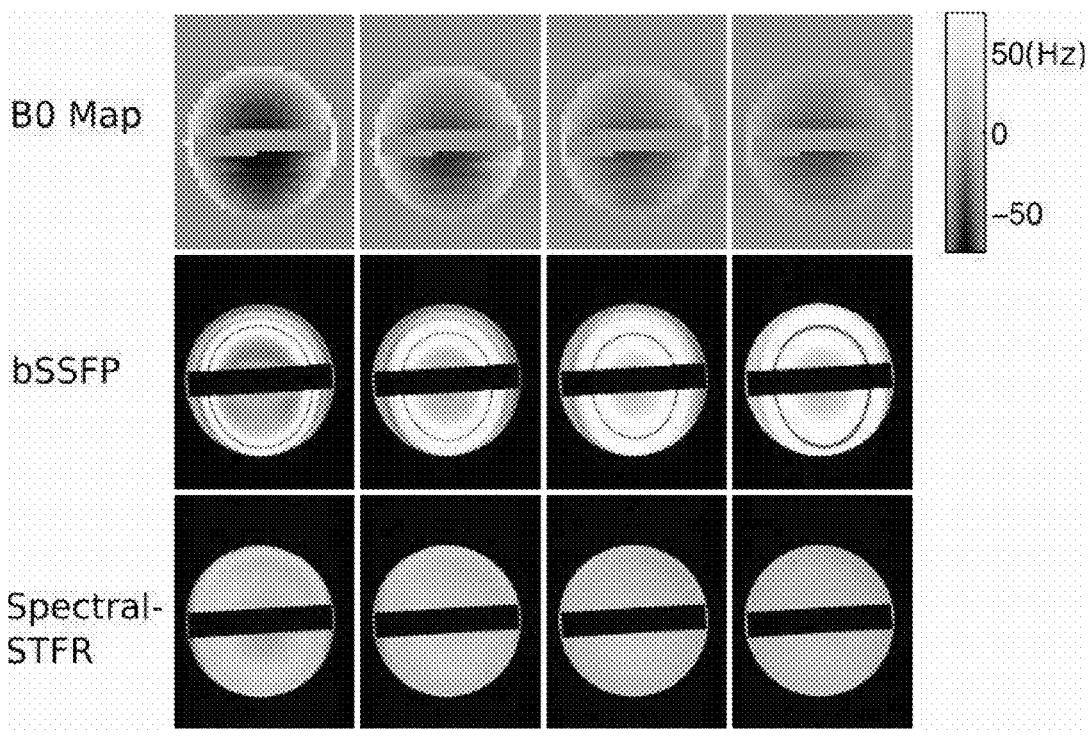
FIG. 8 is an illustration comparing B0 field map images, bSSFP images, and the images acquired by the method of the subject invention, over multiple slices of the object acquired in a phantom experiment.

FIG. 8 illustrates the B0 field map, bSSFP, and the spectral-STFR image for four slices spanning 4 cm taken in a phantom experiment. The banding artifacts observed in bSSFP that are within a target frequency range defined approximately between −75 Hz and +75 Hz have been successfully reduced in the spectral-STFR images. The spectral-STFR images are also more uniform.

Figure 9:
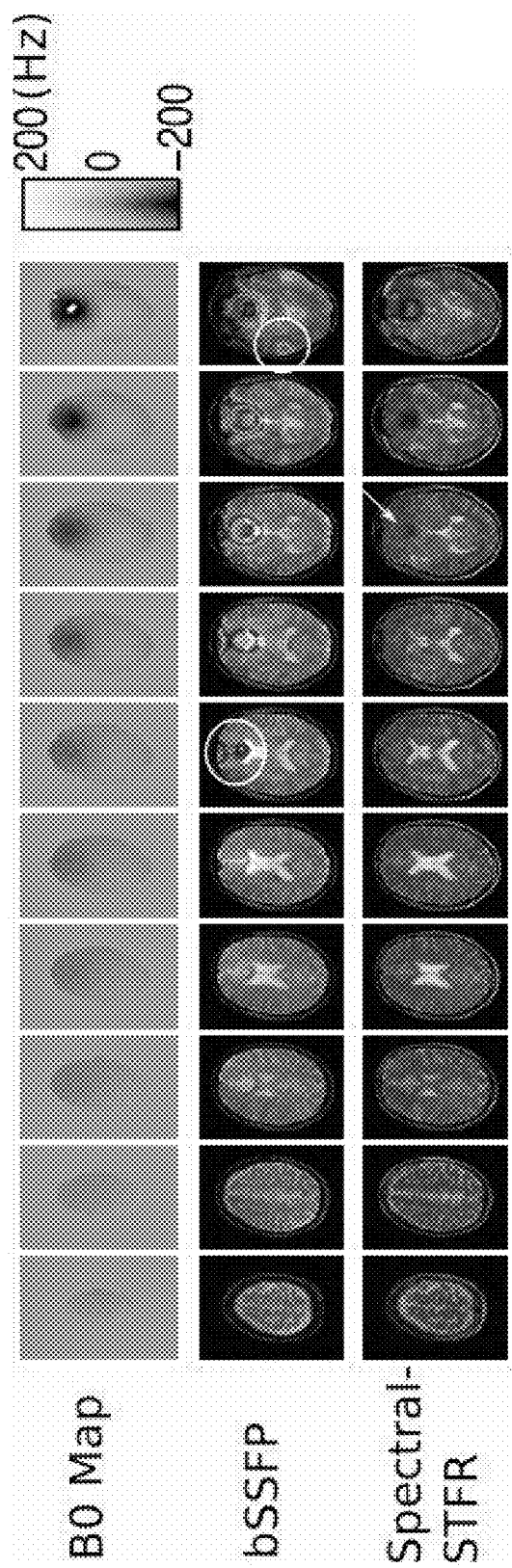
FIG. 9 is an illustration comparing B0 field map images, bSSFP images, and the images acquired by the method of the subject invention, over multiple slices of the object acquired in vivo.

FIG. 9 illustrates the B0 field map, bSSFP, and the spectral-STFR image for 7 slices taken in an in vivo experiment. The spectral-STFR images exhibit similar image contrast as compared with the bSSFP images. The banding artifacts observed in bSSFP (shown within the circles of FIG. 9) that are within a target frequency range defined approximately between −120 Hz and +50 Hz have been successfully removed in the STFR images. The spectral-STFR method successfully reduces the banding artifacts within the target frequency range. Signal drop in the spectral-STFR image (shown at tip of the arrow in FIG. 9) occurs when off-resonance frequency goes beyond the target range. However, the signal drop in the spectral-STFR image is smaller than the signal drop in the bSSFP image.

Alternative/Additional Embodiment

As described above, the first pulse α and/or second pulse β may be spectrally designed according to a specific frequency spectrum in the implementation of the spectral-STFR method. This frequency spectrum has a spectral bandwidth. One example of the spectral bandwidth utilized above for the spectral-STFR method is approximately +/−75 Hz or a total bandwidth of 150 Hz. This spectral bandwidth is sufficient to excite the entire ROI 28. One of the general challenges of using the spectral-STFR method may be achieving the desired spectral bandwidth. For example, the spectrally designed first pulse α and/or second pulse β may encounter limitations on the amount of phase prewinding in view of the spectral bandwidth. Such limitations on the amount of phase prewinding are a function of the spectral bandwidth as well as the echo time.

To combat such limitations, the spectrally designed first pulse α and/or second pulse β may be configured to vary spatially. In other words, the spectrally designed first pulse α and/or second pulse β may vary spatially within a slice or within the ROI 28. The spectral bandwidth (or frequency band of interest) by which the first pulse α and/or second pulse β are spectrally designed may vary from region to region. For simplicity, such pulses may be defined as "spectral-spatial" (SPSP) pulses or "spectrally and spatially designed" pulses.

The spectral-spatial pulse utilizes a spectral bandwidth in each spatial location (region) that is less than the spectral bandwidth that is sufficient to excite the entire ROI 28. By utilizing a narrower spectral bandwidth, the amount of phase prewinding may be increased. Moreover, if the spectral bandwidth is made narrower, there is a wider time interval around the echo time where the signal strength is large. Having a wider time interval around the echo time alleviates limitations on the possible amount of phase prewinding. In turn, the narrower bandwidth allows the spectrally designed first pulse α and/or second pulse β to be more easily designed and implemented.

Additionally, the spectral-spatial pulse gives the spins 32 a phase that is defined by the spectral pulse, whereby the spectral bandwidth varies spatially. Thus, determining an exact phase of the spins 32 at each location is not required. Rather, the spectral-spatial pulse utilizes the local frequency of the spins 32 that lie within the appropriate spectral bandwidth. By doing so, the spectral-spatial pulse alleviates the need to give each spin 32 a phase based on its spatial location alone. Unlike spatial pulses that produce T2*-like contrast, the spectral-spatial pulses spectrally rephases spins 32 within the frequency band producing T2-like contrast, which is more desirable in some applications. Moreover, the spectral-spatial pulse may be more robust than conventional spatial pulse designs.

Figure 10:
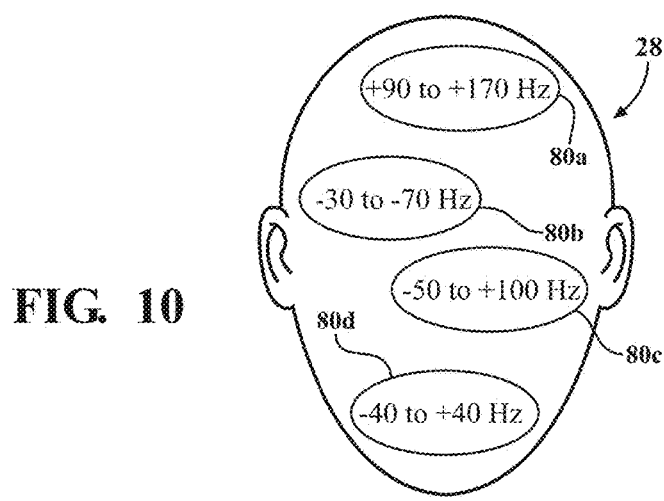
FIG. 10 illustrates a region of interest represented by a human head wherein a plurality of spectrally and spatially designed pulses provide different spectral bandwidths at different spatial regions in the human head, according to one embodiment.

FIG. 10 illustrates the ROI 28 represented by a human head wherein spectral-spatial pulses provide different spectral bandwidths at different regions 80*a*-80*d* in the human head. In other words, the spectral bandwidth varies from region to region 80*a*-80*d*. Each region 80*a*-80*d* behaves similar to regions that are manipulated by the spectral pulse(s) described above, however, the spectral bandwidth varies spatially. In FIG. 10, each spectral bandwidth within each region 80*a*-80*d* is narrower than the total bandwidth capable of exciting the entire ROI 28, in this case 150 Hz. However, any given spectral bandwidth within any given region 80*a*-80*d* may be equal to the total bandwidth capable of exciting the entire ROI 28, e.g., 150 Hz. Any number of the regions 80*a*-80*d* may have different spectral bandwidths. For example, the spectral bandwidth of region 80*a* is 80 Hz while the spectral bandwidth of region 80*b* is 100 Hz. Furthermore, any number of the regions 80*a*-80*d* may have the same spectral bandwidth. For example, the spectral bandwidth of regions 80*a* and 80*d* are both 80 Hz. The cut-off frequencies (limits) of the spectral bandwidth may also vary for any given region 80*a*-80*d*. For example, although the spectral bandwidths of regions 80*a* and 80*d* are both 80 Hz, region 80*a* has a lower cut-off frequency of 90 Hz while region 80*d* has a lower cut-off frequency of −40 Hz. The same may apply for the upper cut-off frequency. Additionally, the center frequency of the spectral bandwidth may be the same or different for any given region 80*a*-80*d*. The spectral-spatial pulses provide different spectral bandwidths at different regions 80*a*-80*d* for a variety of reasons. For example, the magnetic field and homogeneity may not be uniform depending on different parts of the anatomy, e.g., the sinus area. The differences in magnetic field and homogeneity may cause a frequency shift. The spectral-spatial pulse applied to such different parts of the anatomy may require the spectral bandwidth to be designed to the frequency shift.

The spectral-spatial pulse may be implemented according to various methods. In one embodiment, only the first pulse α is spectrally-spatially designed. In such instances, spectral-spatial designing is utilized only for excitation (tip-down) of the spins 32. In another embodiment, only the second pulse β is spectrally-spatially designed. In such instances, spectral-spatial designing is utilized only for recovery (tip-up) of the spins 32. In yet another embodiment, both the first pulse α and the second pulse β are spectrally-spatially designed such that spectral-spatial designing is utilized for both excitation and recovery of the spins 32.

FIG. 11 illustrates charts comparing characteristics of a first spectrally designed pulse (FIG. 11A) and a second spectrally designed pulse implemented by sub-pulses (FIG. 11B). In FIG. 11A, the first spectrally designed pulse (11A-top) has a continuous waveform. The first spectrally designed pulse exhibits a particular magnitude (11A-middle) and phase response (11A-bottom). On the other hand, the second spectrally designed pulse implemented by sub-pulses (11B-top) has a discrete waveform. Nevertheless, the second spectrally designed pulse implemented by sub-pulses exhibits a nearly identical magnitude (11B-middle) and phase response (11B-bottom) as compared with magnitude and phase response exhibited by the first spectrally designed pulse. The spectrally designed pulse may be implemented according to various other embodiments without departing from the scope of the invention.

In FIG. 11A (top), the spectrally designed pulse is constructed by three separate sub-pulses 82, 84, 86. The first sub-pulse 82 is applied at the beginning of the spectrally designed pulse. The third sub-pulse 86 is applied at the end of the spectrally designed pulse. The second sub-pulse 84 is applied between the first and third sub-pulses 82, 86, and more specifically, at a midpoint between the first and third sub-pulses 82, 86. In one embodiment, the sub-pulses 82, 84, 86 may be derived by coarsely sampling an RF pulse.

Figure 12:
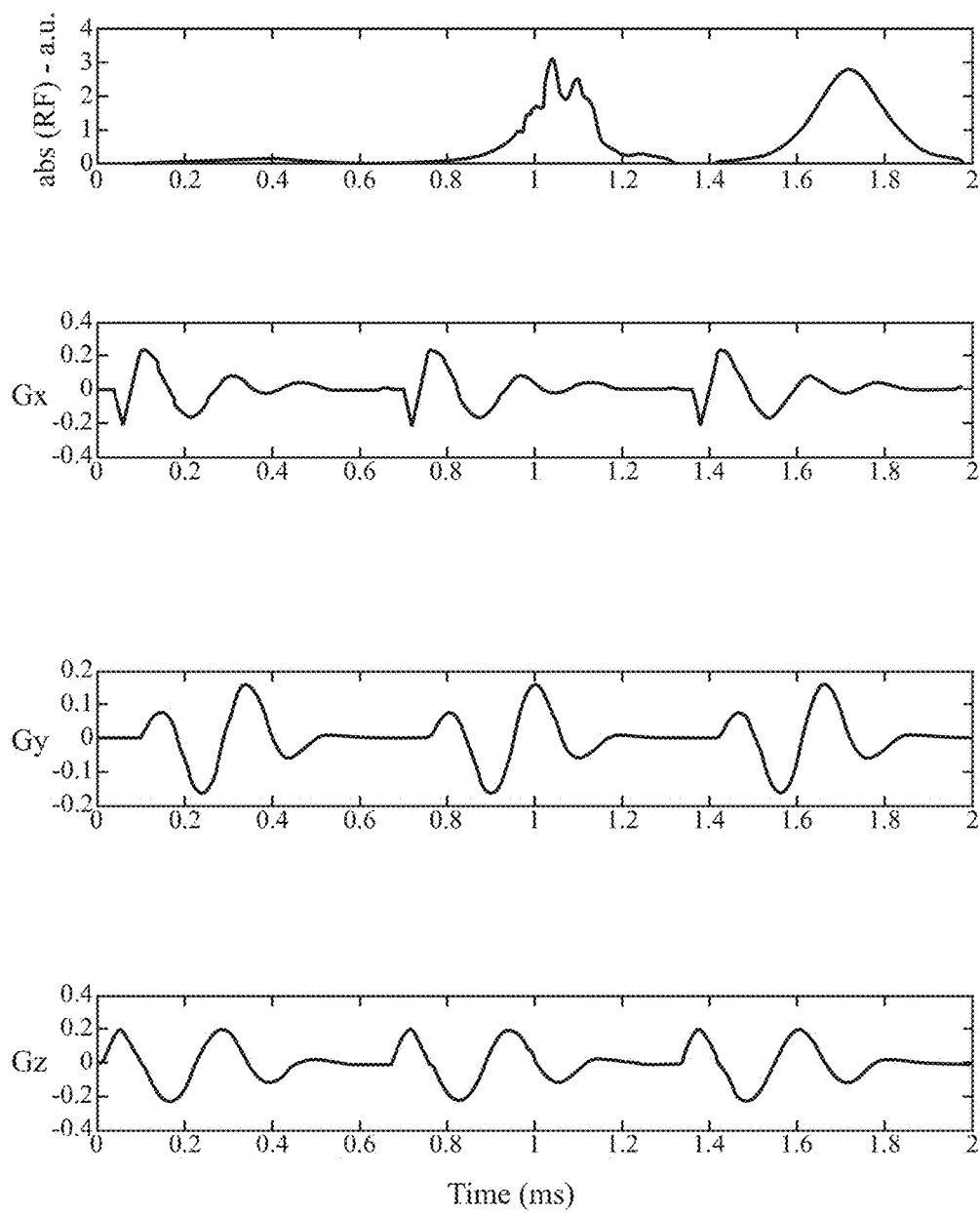
FIG. 12 illustrates charts showing implementation of the spectrally and spatially designed pulse, according to one embodiment.

Each sub-pulse 82, 84, 86 may be replaced with a spatial variant. Mainly, each sub-pulse 82, 84, 86 may be replaced with a spatially selective pulse so as to produce frequency bands that vary across the slice. In such instances, the spectral-spatial pulse is formed, as described above. FIG. 12 illustrates the spectral-spatial pulse according to one configuration. FIG. 12 illustrates the waveform of the spectral-spatial pulse (top) having spectral rephasing properties and spatial variations. The waveforms associated with the magnetic field gradients Gx, Gy, Gz that implement the spatial component of the spectral-spatial pulse are shown in FIG. 12 (bottom three charts, respectively). As shown, the waveform of the each magnetic field gradients Gx, Gy, Gz exhibits a pattern that is repeated over the duration of the spectral-spatial pulse. In one embodiment, as shown in FIG. 12, the pattern is repeated three times during the duration of the spectral-spatial pulse. The waveforms of the magnetic field gradients Gx, Gy, Gz are nearly identical, but may have the pattern slightly shifted from one another.

The spectral-spatial pulse may be implemented according to various other ways other than the implementation as shown in FIG. 12. In one embodiment, the spectral-spatial pulse is designed by specifying a desired (target) spectral-spatial pattern, e.g., $d(\Omega, r)$ and utilizing iterative pulse design methods. The iterative pulse design methods may be used with joint design of the waveforms of the magnetic field gradients Gx, Gy, Gz and the waveform of the spectral-spatial pulse. The method of designing the above-described sub-pulses 82, 84, 86 may be utilized to initialize the iterative pulse design method. Furthermore, the spectral-spatial pulse can be designed to utilize any suitable parallel excitation hardware, thereby allowing more spatial specification of the patterns.

The present invention has been described herein in an illustrative manner. It is to be understood that the terminology that has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A method of acquiring image data with an MRI system from an object including a plurality spins, said method comprising the steps of:
applying a magnetic field to the object to align the spins along a longitudinal axis;
applying a first pulse to the spins for rotating the spins from the longitudinal axis toward a transverse plane;
acquiring image data from the spins during a free precession interval in which the spins precess in the transverse plane;
applying a second pulse to the spins for rotating the spins from the transverse plane to at least substantially along the longitudinal axis; and
spectrally designing at least one of the first and second pulses including pre-winding a phase of the spins based on frequency such that the phase of the spins is frequency dependent and matching the phase of the spins to a product of an off-resonance frequency of the spins and the free precession interval.

2. The method of claim 1 wherein spectrally designing is performed independent of a spatial position of the spins.

3. The method of claim 1 further including spectrally designing both the first and second pulses.

4. The method of claim 1 further including spectrally designing the second pulse and not the first pulse.

5. The method of claim 1 wherein applying at least one of the first and second pulses includes applying an RF waveform that is designed by performing an optimization method that considers at least one of a target excitation pattern, constraints on RF power, constraints on pulse length, and excitation accuracy.

6. The method of claim 1 wherein spectrally designing the first pulse includes computing a frequency spectrum defined by $d(\omega)=\sin \alpha \exp^{(i\omega T_{free}/2)}$, wherein $\alpha$ is a flip angle of the spins, $\omega$ is an off-resonance frequency of the spins, and $T_{free}$ is the free precession interval.

7. The method of claim 1 wherein spectrally designing the second pulse includes computing a frequency spectrum defined by $d(\omega)=\sin \beta \exp^{(-i\omega T_{free}/2)}$, wherein $\beta$ is a flip angle of the spins, $\omega$ is an off-resonance frequency of the spins, and $T_{free}$ is the free precession interval.

8. The method of claim 1 further including setting magnetic field gradients of the MRI system to zero during application of at least one of the first and second pulses.

9. The method of claim 1 further including applying a third pulse after application of the second pulse for eliminating residual transverse magnetization resulting from the spins not being aligned along the longitudinal axis.

10. The method of claim 1 further including spatially designing at least one of the first and second pulses such that the phase of the spins is also spatially dependent.

11. The method of claim 10 wherein spatially designing at least one of the first and second pulses includes further matching the phase of the spins to a function of the off-resonance frequency of the spins as the off-resonance frequency varies spatially within a predetermined spatial region.

12. A method of acquiring image data with an MRI system from an object including a plurality spins, said method comprising the steps of:
applying a magnetic field to the object to align the spins along a longitudinal axis;
applying a first pulse to the spins for rotating the spins from the longitudinal axis toward a transverse plane;
acquiring image data from the spins during a free precession interval in which the spins precess in the transverse plane;
applying a second pulse to the spins for rotating the spins from the transverse plane to at least substantially along the longitudinal axis; and
designing at least one of the first pulse and second pulse such that the phase of the spins are spectrally and spatially dependent, wherein the designing includes matching a phase of the spins to a product of an off-resonance frequency of the spins and the free precession interval such that the phase of the spins is frequency and spatially dependent.

13. An MRI system configured to acquire image data from an object according to a plurality of slices, said MRI system comprising:
a field magnet configured to generate a magnetic field through the object to align the spins along a longitudinal axis;
an RF transmitter configured to apply a sequence of RF pulses for manipulating orientation of the spins, said RF transmitter configured to apply a first pulse to the spins for rotating the spins from the longitudinal axis toward a transverse plane;
an RF receiver configured to acquire image data from the spins during a free precession interval in which the spins precess in the transverse plane;
said RF transmitter is configured to apply a second pulse to the spins for rotating the spins from the transverse plane to at least substantially along the longitudinal axis; and a processor configured to spectrally design at least one of the first and second pulses by matching a phase of the spins to a product of an off-resonance frequency of the spins and the free precession interval such that the phase of the spins is frequency dependent.

14. The MRI system of claim 13 wherein the second pulse is spectrally designed and the first pulse is not spectrally designed.

15. The MRI system of claim 13 wherein the first and second pulses are both spectrally designed such that the phase of the spins is also spatially dependent.

16. The MRI system of claim 13 wherein at least one of the first and second pulses is further spatially designed such that the phase of the spins is matched to a function of the off-resonance frequency of the spins as the off-resonance frequency varies spatially within a predetermined spatial region.

17. The MRI system of claim 13 including a broad frequency spectrum that has a broad bandwidth sufficient to excite all the spins within the object, wherein the frequency spectrum has a bandwidth that is less than the broad bandwidth such that spins within the predetermined spatial region are excited and spins outside the predetermined spatial region are not excited after application of at least one of the spectrally and spatially designed first and second pulses.

\* \* \* \* \*